United States Patent [19]
Kashihara et al.

[11] Patent Number: 4,571,688
[45] Date of Patent: Feb. 18, 1986

[54] WIRE BONDING APPARATUS

[75] Inventors: Tomio Kashihara, Yokohama; Katsuhiko Aoyagi, Kawasaki, both of Japan

[73] Assignee: Tokyo Shibaura Denki Kabushiki Kaisha, Japan

[21] Appl. No.: 532,513

[22] Filed: Sep. 15, 1983

[30] Foreign Application Priority Data

Sep. 16, 1982 [JP] Japan ................. 57-161213

[51] Int. Cl.4 .................. G06G 7/64; B23K 1/06; B23K 5/00
[52] U.S. Cl. .................. 364/477; 228/1.1; 228/8; 228/102; 228/110
[58] Field of Search ............. 364/477; 228/1 R, 4.5, 228/7, 8, 9, 102, 110

[56] References Cited

U.S. PATENT DOCUMENTS

| | | | |
|---|---|---|---|
| 3,784,079 | 1/1974 | Spanjes | 228/8 |
| 4,069,961 | 1/1978 | Nicklaus et al. | 228/1 R |
| 4,125,943 | 11/1978 | Ando | 228/9 |
| 4,266,710 | 5/1981 | Bilane et al. | 228/8 |
| 4,409,659 | 10/1983 | Devine | 228/1 R |
| 4,438,880 | 3/1984 | Smith et al. | 228/110 |

Primary Examiner—Jerry Smith
Assistant Examiner—John R. Lastova
Attorney, Agent, or Firm—Cushman, Darby & Cushman

[57] ABSTRACT

A wire bonding apparatus in which a supersonic oscillator is provided for applying a supersonic vibration to a capillary through the medium of a tool arm at the time of bonding, and the supersonic oscillator is controlled for the adjustment of the oscillation time and/or amplitude of supersonic oscillation to regularize the ball shape, while monitoring the deformation of a ball at the end of a wire by means of a gap sensor which detects the relative positions of the tool arm and a tool lifter arm.

9 Claims, 29 Drawing Figures

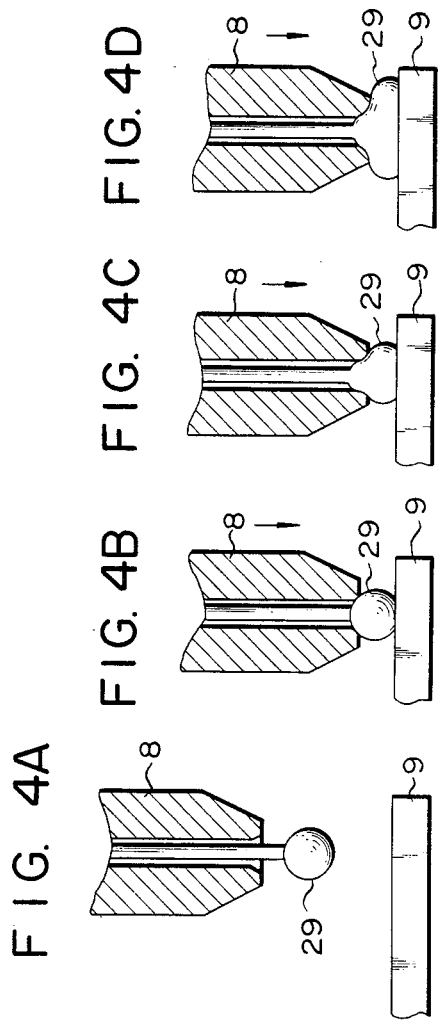

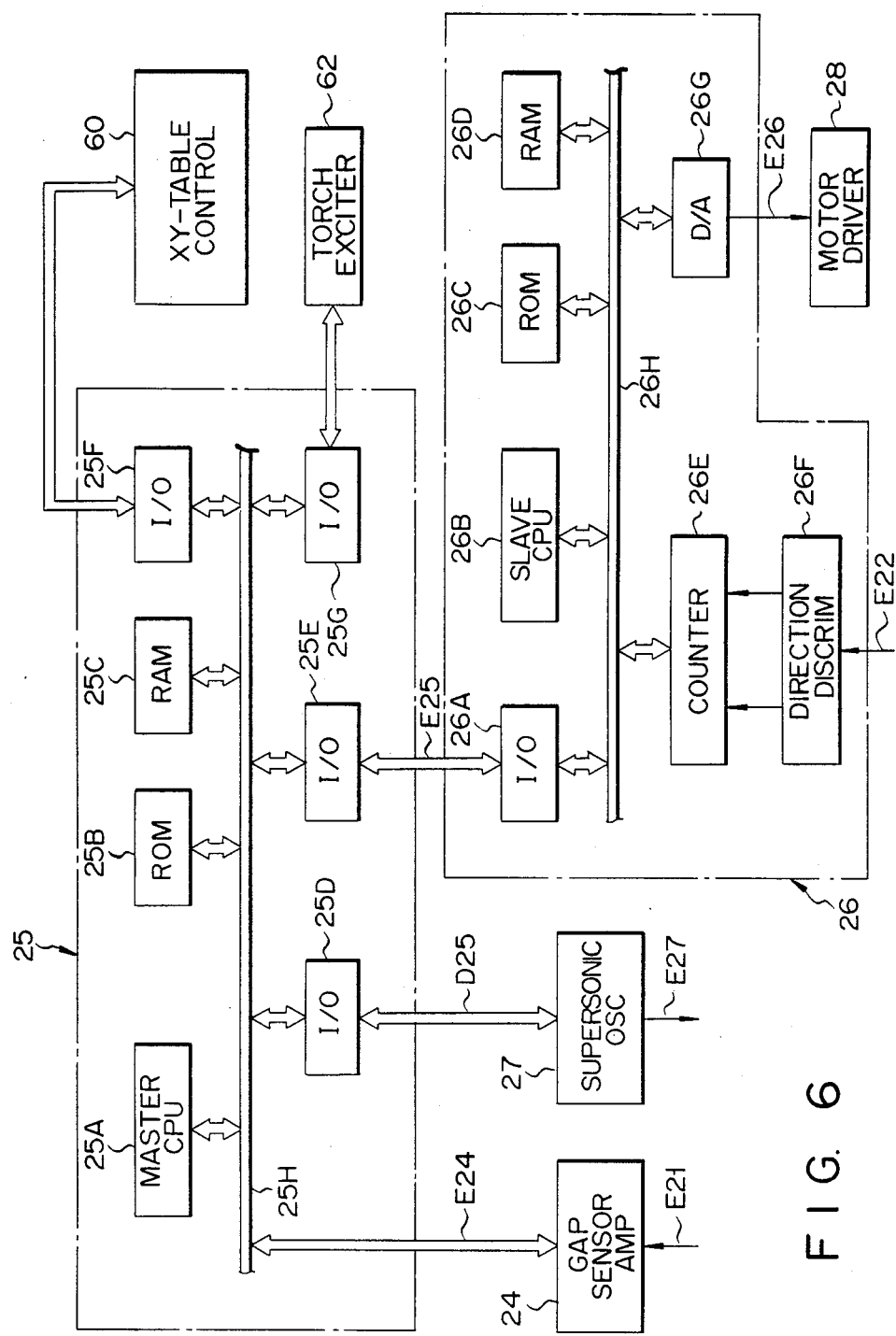
F I G. 6

F I G. 8
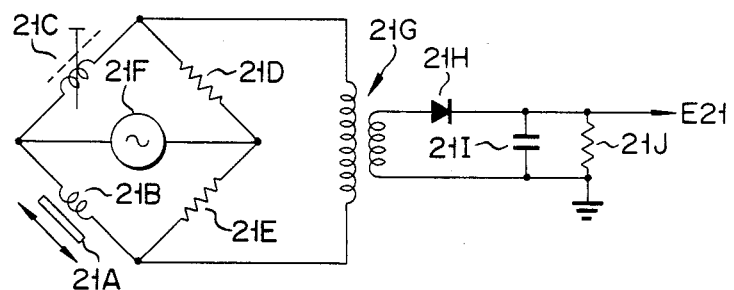

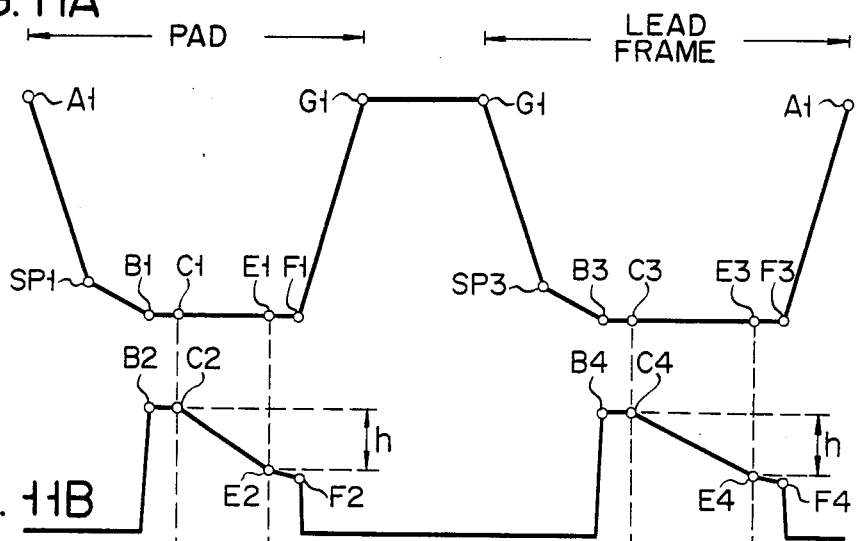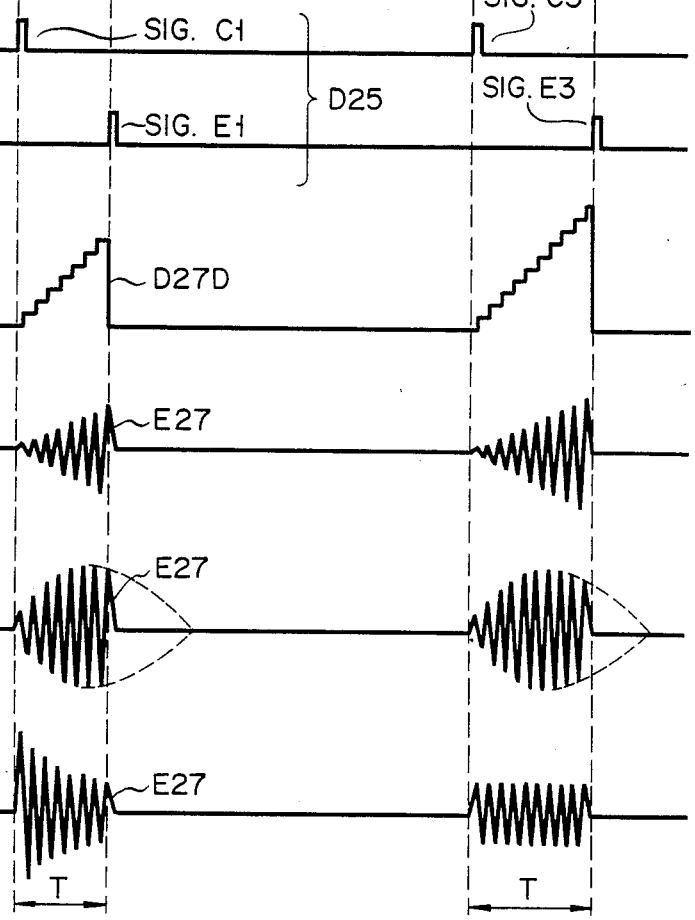

WIRE BONDING APPARATUS

BACKGROUND OF THE INVENTION

The present invention relates to a wire bonding apparatus for bonding, e.g., a gold wire to a pellet in an IC assembling process.

Conventionally, in wire bonding apparatuses used in assembling integrated circuits, a capillary penetrated by a gold wire is first pressed against and bonded to the bonding pad of a pellet, as a first bonding point. Then, the capillary is moved in the vertical direction (perpendicular to the pellet surface) and in the XY direction (parallel to the pellet surface) to let out the wire, so that the wire is bonded to the lead portion of a lead frame, as a second bonding point. Thereafter, the capillary is raised, and the wire is cut. The wiring of the IC is completed by repeating these processes.

In the aforementioned bonding operation, the bonding force and temperature employed when the capillary presses a gold ball at the end of the gold wire against the pellet surface are very important factors in terms of the bonding results.

The bonding methods include two systems; thermal compression bonding (the TC system) and thermal compression and supersonic bonding (the TS system). In the TC system, the pellet is preheated to about 300° C. before bonding. In the TS system, the gold ball is pressed against the pellet, which is kept at 200° C. or below; and, at the same time, the capillary is subjected to supersonic vibration, so that the gold ball is melted for bonding by the supersonic vibrational energy.

In the TS system, the capillary applies a given force to the gold ball; and, then, a supersonic vibration is applied to the capillary for a given time to melt the gold ball. Thus, a layer of an alloy of gold and aluminum develops on the pellet for bonding. In this case, the time during which the supersonic vibration is applied is fixed. Accordingly, if the amount of supersonic vibrational energy absorbed by the gold ball varies, due to malfunction of the bonding apparatus or surface conditions of the pellet, the shape of the gold ball after the compression bonding will vary, lowering the uniformity and reliability to the bonding portions.

FIG. 1A shows an ideal state in which a gold wire b is bonded to a pellet a. An aluminum film d deposited on an electrode portion c and a gold ball e are formed into an alloy layer by proper heating and supersonic vibration. The alloy layer is uniformly formed over the entire surface of the pressure-bonded ball e. In this case, the bonding strength estabilished between the pellet a and the gold ball e is great.

However, if the bonding force is too great, or if the supersonic vibration is applied too long, the gold ball e will be crushed and bulge out from the electrode portion c, as shown in FIG. 1B. Thus, the gold ball e will come into contact with peripheral wiring patterns (not shown), making the pellet a defective. If the supersonic vibration is applied for too short a time, on the other hand, the bonded ball e will be separated from the pellet a by slight vibration after bonding.

SUMMARY OF THE INVENTION

Since the present invention has been contrived in view of the above, and it is intended to provide a wire bonding apparatus capable of forming bonding balls of a regular shape on a bonding portion, thereby improving the reliability of the bonding portion.

The essential features of the invention lie in the fact that a supersonic oscillator is provided for applying a supersonic vibration to a capillary through the medium of a tool arm at the time of bonding, and in the fact that the supersonic oscillator is controlled for the adjustment of the oscillation time and/or amplitude of supersonic oscillation, to make the ball's shape uniform, while monitoring the deformation of a ball by means of a gap sensor which detects the relative positions of the tool arm and a tool lifter arm. Thus, a wire bonding apparatus is provided which has improved reliability and can form a bonding ball of a regular shape, even though supersonic vibrational energy applied to the ball is changed by variations in the output from the supersonic oscillator, the diameter of the ball, and the surface conditions of a pellet, etc.

BRIEF DESCRIPTION OF THE DRAWINGS

FIGS. 1A to 1C show bonding conditions between a gold ball at the end of a wire and the bonding pad of an IC pellet, wherein FIG. 1A shows an ideal bonding state, FIG. 1B shows a defective bonding state caused by excessive bonding force, and FIG. 1C shows a state in which the gold ball of the wire is separated from the bonding pad, due to an insufficient bonding force;

FIGS. 4A to 4D show the gold ball of the wire in positions corresponding to individual points on the curve of FIG. 3A;

FIG. 6 is a block diagram showing the internal configurations of a bonder control circuit 25 and a tool position control circuit 26 shown in FIG. 2;

FIG. 8 is a circuit diagram showing a specific example of a gap sensor 21 shown in FIG. 2;

FIGS. 11A to 11H are diagrams illustrating how the supersonic oscillation is performed by the configuration of FIG. 10.

DETAILED DESCRIPTION OF THE PREFERRED EMBODIMENT

Figure 1:
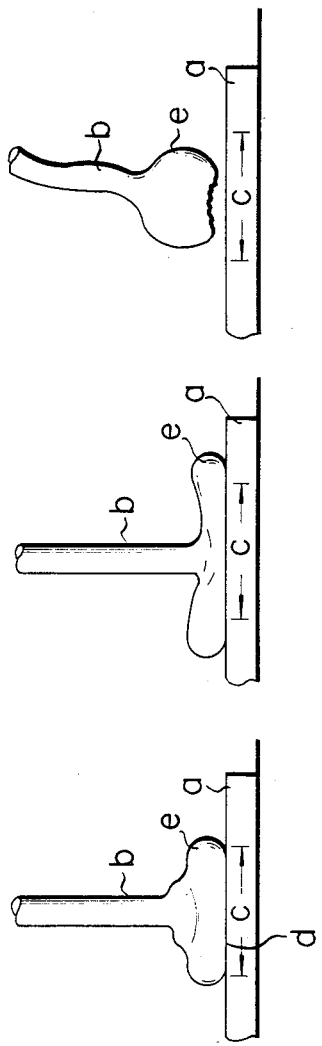
Figure 2:
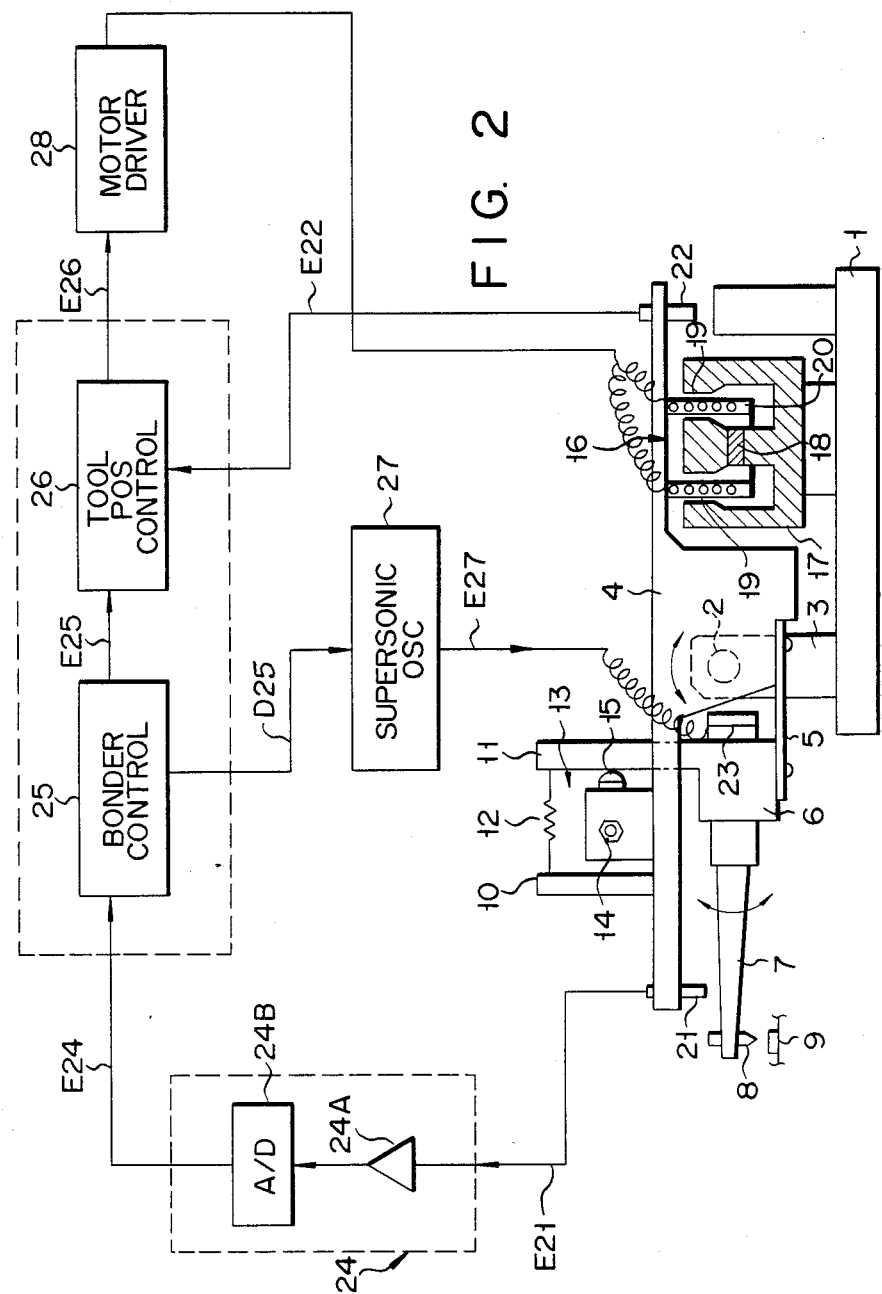
FIG. 2 shows a configuration of a wire bonding apparatus according to one embodiment of the present invention.

A wire bonding apparatus according to one embodiment of the present invention may now be described in greater detail, with reference to the accompanying drawings. FIG. 2 shows a schematic configuration of the wire bonding apparatus. A support 3 having a shaft 2 is set on the front side of the top surface of an XY table 1. A tool lifter arm 4 is swingably mounted on the shaft 2 of the support 3. A tool arm holder 6 is fixed to the tool lifter arm 4 by means of a leaf spring 5, while a tool arm 7 is attached to the tool arm holder 6. A capillary 8 is attached to the front end of the tool arm 7, facing a semiconductor IC pellet 9. A tension spring 12 is stretched between a spring peg 10 on the front end side of the top surface of the tool lifter arm 4 and a spring peg 11 of the tool arm holder 6. Also, an initial position setting mechanism 13 is provided between the two spring pegs 10 and 11. The mechanism 13 is so constructed that an adjust screw 14 is rotated to move an initial position setting pin 15, thereby setting the stationary position of the capillary 8.

A linear motor 16 serving as a driving source is provided on the central portion of the top surface of the XY table 1. The linear motor 16 comprises a magnetic circuit formed of a yoke 17 and a permanent magnet 18, and a moving coil 20 which swings within a plane perpendicular to the flow of magnetic flux passing through gap portions 19 of the magnetic circuit. Thus, the linear motor 16 has the same configuration as that of the so-called dynamic type speaker. The moving coil 20 is attached to the rear end side of the under surface of the tool lifter arm 4. The tool lifter arm 4 is swung up and down by the linear motor 16, in such a way that the capillary 8 is moved up and down by means of the tool arm 7. A gap sensor 21 for detecting the relative displacement between the tool lifter arm 4 and the tool arm 7 is attached to the front end portion of the arm 4. A position sensor 22 for detecting the position and moving speed of the tool lifter arm 4 is attached to the rear end portion of the arm 4. A linear encoder or a rotary encoder rotating about the shaft 2 may be used for the position sensor 22. A device disclosed in Japanese Patent Application No. 153372/81 filed on Sept. 28, 1981 is a typical example of the sensor 21. The disclosure of the Japanese Patent Application is incorporated in the present invention.

Among specific examples of the sensor 22 are linear encoders (or rotary encoders) disclosed in the following
(i) U.S. Pat. No. 4,100,420 issued on July 11, 1978 (Metcalf et al.);
(ii) U.S. Pat. No. 4,074,258 issued on Feb. 14, 1978 (Dore et al.);
(iii) U.S. Pat. No. 3,891,143 issued on June 24, 1975 (Haeusler);
(iv) U.S. Pat. No. 3,599,004 issued on Aug. 10, 1971 (Grendelmeier);
(v) U.S. Pat. No. 3,364,359 issued on Jan. 16, 1968 (Cronin);
(vi) U.S. Pat. No. 3,309,525 issued on Mar. 14, 1979 (Johnson Jr.);
(vii) U.S. Pat. No. 3,096,444 issued on July 2, 1983 (Seward);
(viii) U.S. Pat. No. 2,995,705 issued on Aug. 8, 1961 (Walker et al.); and
(ix) U.S. Pat. No. 2,993,200 issued on July 18, 1961 (Walker et al.).

The disclosures of all these U.S. patents are incorporated in the present invention. Encoders for the sensor 22 are commercially available (e.g., from Nippon Kogaku Co., Ltd., Japan). A supersonic vibrator 23 is attached to the rear end portion of the tool arm 7. The supersonic vibrator 23 applies a supersonic vibration to the capillary 8 through the medium of the tool arm 7.

The gap sensor 21 is connected to a bonder control circuit 25 through a gap sensor amplifier 24 which is formed of a linear amplifier 24A and an AD converter 24B. An output signal E21 of the sensor 21 is converted into a digital signal E24 with a predetermined magnitude by the gap sensor amplifier 24, and is applied to the input of the bonder control circuit 25. Based on the digital signal E24, the bonder control circuit 25 detects and controls the relative displacement between the tool lifter arm 4 and the tool arm 7 and the variation of the relative displacement, and delivers a position command signal E25 and an oscillation start/oscillation stop instruction signal D25, respectively, to a tool position control circuit 26 and a supersonic oscillator 27 which actuates the supersonic vibrator 23. Receiving the position command signal E25, the tool position control circuit 26 supplies a drive signal E26 to a motor driver 28, in accordance with a two-phase sine wave signal E22 related to the position and speed delivered from the position sensor 22. Based on the drive signal E26, the driver 28 drives the linear motor 16. Thus, a control target is given by the position command signal E25, and servo control for the position and moving speed of the tool lifter arm 4 is effected.

Figures 3A, 3B, 3C:
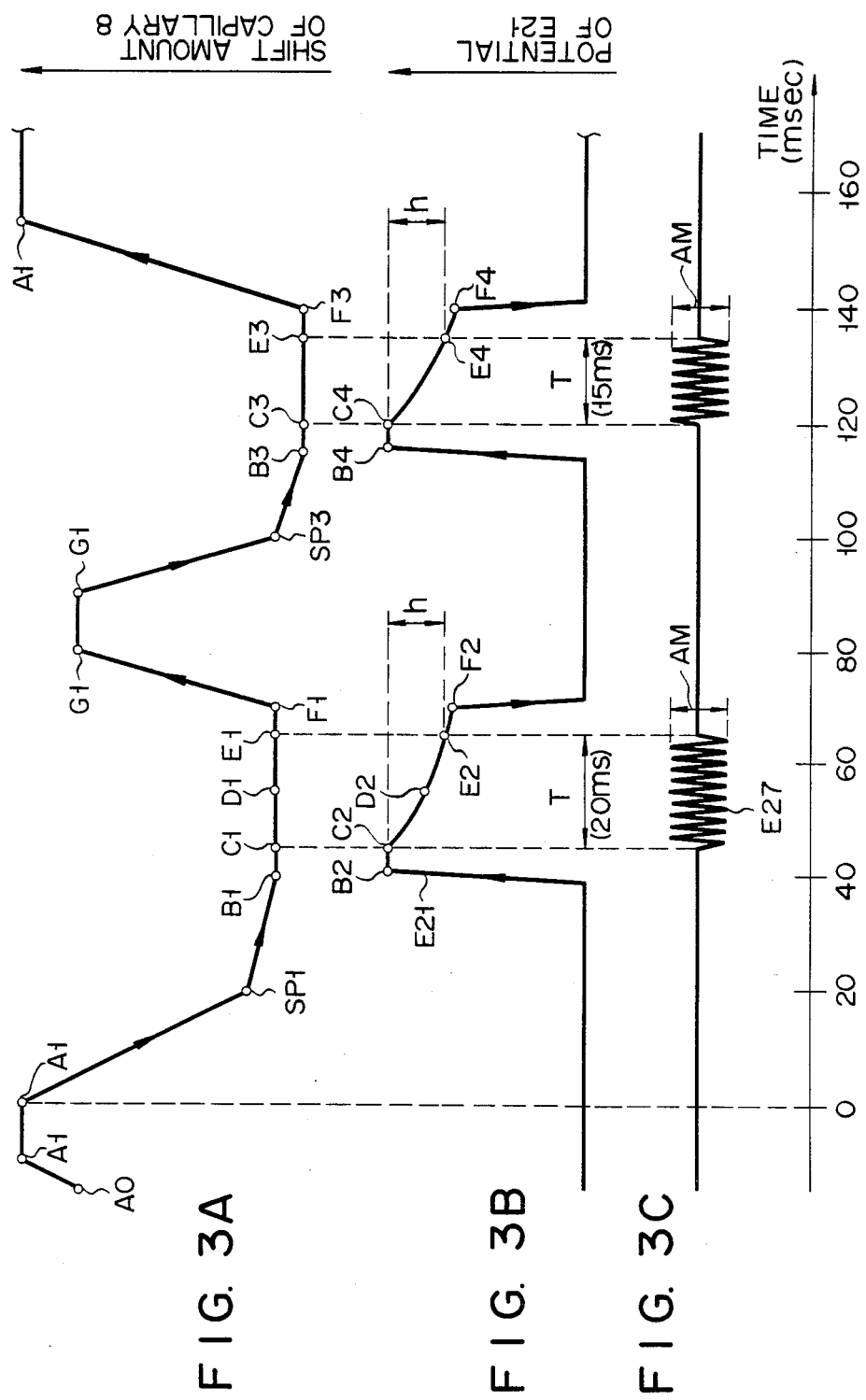
FIGS. 3A to 3C are diagrams illustrating the operation of the apparatus shown in FIG. 2.
Figure 5:
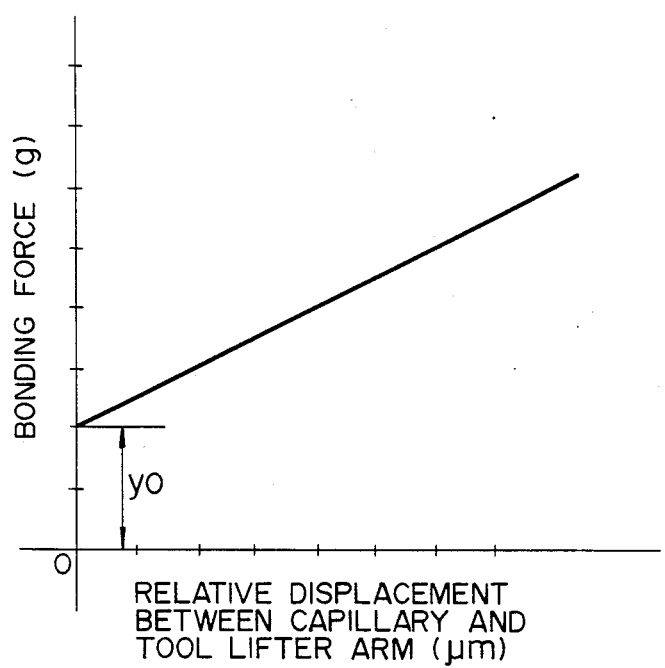
FIG. 5 is a graph showing the relationship between capillary displacement and bonding force.

The operation of the wire bonding apparatus of the afore-mentioned configuration may be described as follows. FIG. 3A shows a typical tool (capillary) curve. FIG. 3B shows the output signal E21 of the gap sensor 21 changes corresponding to the tool curve of FIG. 3A, while FIG. 3C shows an output signal E27 of the supersonic oscillator 27 corresponding to the curve of FIG. 3B. FIGS. 4A to 4D show the gold ball 29 in states corresponding to the tool curve of FIG. 3A. First, at point A1 of FIG. 3A, the extreme end of the gold wire is melted by an electric torch, and is formed into a spherical body by surface tension. In this state, the position command signal E25 is delivered to the tool position control circuit 26 in accordance with tool curve data stored in the bonder control circuit 25. As a result, the capillary 8 starts to descend at a speed represented by the downward slope of FIG. 3A. The bonder control circuit 25 continues to monitor the output signal E21 from the gap sensor 21 through the amplifier 24. When the capillary 8 is lowered to point B1 of the tool curve, the level of the output signal E21 of the gap sensor 21 changes suddenly, as shown in FIG. 3B. This sudden change is caused since, if an upward force applied to the capillary 8 whose tip end abuts against the pellet 9 exceeds a predetermined initial force y0, as shown in FIG. 5, the tension spring 12 and the leaf spring 5 bend, causing relative displacement between the tool lifter arm 4 and the tool arm 7.

The bonder control circuit 25 detects the sudden change in the output signal E21 of the gap sensor 21, thereby registering the contact between the pellet 9 and the capillary 8. When the tool lifter arm 4 is lowered a given distance after the contact, the capillary 8 presses the gold ball 29 against the pellet 9 with a prescribed force. This bonding force applying condition appears at point C1 of FIG. 3A and the state shown in FIG. 4B.

When the bonder control circuit 25 delivers the oscillation start instruction D25 to the supersonic oscillation 27, the supersonic vibrator 23 produces supersonic vibrational energy. The supersonic vibrational energy is transmitted through the tool arm 7 to the gold ball 29, and heat is generated by vibrational friction between the capillary 8 and the gold ball 29 and between the gold ball 29 and the pellet 9. Namely, the supersonic vibrational energy is changed into heat in the gold ball 29, so that the gold ball 29 is melted and starts to be deformed. At the same time, gold of the gold ball 29 and aluminum of the pellet 9 are joined together to form an alloy layer. This process can be noticed through variation h of the output potential of the gap sensor 21 at points C2, D2 and E2 of FIG. 3B. Points C2, D2 and E2 of FIG. 3B correspond to the states shown in FIGS. 4B, 4C and 4D, respectively. A change of distance corresponding to the potential variation h ranges from 20 microns to 40 microns and is preset to a suitable value according to the initial diameter of the gold ball 29. When the variation h reaches the predetermined value, the oscillation stop instruction D25 is delivered to the supersonic oscillator 27, and the state of FIG. 4D corresponding to point E1 of FIG. 3A is obtained. The capillary 8 rises again, two or three milliseconds after this state is reached, and bonding on the lead side is then started. The point (F1 of FIG. 3A) at which the capillary 8 starts to re-rise is indicated by a sudden fall (at point F2 of FIG. 3B) of the level of the signal E21. Also, in lead-frame-side bonding, the ON/OFF (start/stop) instruction D25 may be given to the supersonic oscillator 27 while monitoring the contact between the capillary 8 and the lead frame and while monitoring the fall of the capillary 8 with supersonic vibration, as required.

FIG. 6 shows the internal configurations of the control circuits 25 and 26. The period T (FIG. 3C) during which the output signal E27 of the supersonic oscillator 27 is generated is determined on the basis of the potential change of the output signal E21 from the gap sensor 21 according to an analog or digital system. The digital system is higher in control accuracy than the analog system. Moreover, the digital system is advantageous over the analog system in performing up/down motion control for the capillary 8 in parallel with bonding control. Thus, the control circuits 25 and 26 based on the digital system are disclosed as the best mode of the present invention.

An analog output signal E21 from the gap sensor 21 is converted into a digital signal E24 by a gap sensor amplifier 24. The signal E24 is supplied to a master computer (CPU) 25A in the circuit 25 through a data bus 25H. Model #Z80 from Zilog Co., USA, or a microcomputer equivalent thereto may be used for the CPU 25A. The CPU 25A is coupled via the bus 25H to ROM 25B and a RAM 25C. Also, the CPU 25A is coupled to the supersonic oscillator 27 through the bus 25H and an I/O unit 25D, to the tool position control circuit 26 through an I/O unit 25E, to an XY table control circuit 60 through an I/O unit 25F, and to a torch exciter 62 through an I/O unit 25G. The exciter 62 excites the electric torch (not shown) for melting the extreme end of the gold thin wire at the tip end of the capillary 8 of FIG. 2. The control circuit 60 is coupled to the XY table 1 of FIG. 2 to control the two-dimensional movement thereof. This XY table control circuit 60 is a conventional circuit. The following devices may be used for detecting the bonding pad position on the IC pellet 9 of FIG. 2 in the XY control.

(X) U.S. Pat. No. 4,390,955 issued on June 28, 1983 (Arimura);

(Xi) U.S. Pat. No. 4,291,334 issued on Sept. 22, 1981 (Mese et al.).

The disclosures of these two U.S. patents are incorporated in the present invention. The processes and type of control executed by the CPU 25A will be described later.

The position instruction signal E25 delivered from the I/O unit 25E is supplied to a slave CPU 26B through an I/O unit 26A in the circuit 26 and a data bus 26H. The CPU 26B controls the motion of the capillary 8 along the direction (Z-axis) perpendicular to the plane of the XY table 1. The model #Z80 may be used for the CPU 26B. The CPU 26B is coupled to a ROM 26C and a RAM 26D through the bus 26H. Further, the CPU 26B is coupled to the position detector 22 through a counter 26E and a direction discriminator 26F, and to the motor driver 28 through a DA converter 26G. The discriminator 26F discriminates between the ascent and descent of the capillary 8, and supplies the counter 26E with the signals E22 which vary according to the up-/down motion of the capillary 8. The counter 26E counts the signals E22, and feeds the CPU 26B with a count value indicating the position of the capillary 8.

Referring to the waveform diagrams of FIGS. 3A to 3C and the flow charts of FIGS. 7A to 7E, the operation sequence of the master and slave CPU's 25A and 26B shown in FIG. 6 will be described. In these flow charts, steps ST10 to ST80 constitute the operation sequence of the CPU 25A, while steps ST110 to ST170 constitute that of the CPU 26B.

Incidentally, in the following description, a conventional UP/DOWN counter is used for the counter 26E of FIG. 6 for brevity's sake. In this case, the count value (content) of the counter 26E indicates the shift amount (position) of the capillary 8 which is represented by points A1 to G1, etc., of FIG. 3A. If, for example, the capillary 8 is to be shifted to the point A1, the driving of the linear motor 16 is stopped when the content of the counter 26E corresponds to the point A1, while monitoring the count of the counter 26E.

On the other hand, according to the embodiment of FIG. 9 which will be mentioned later, a programmable down counter is used for the counter 26E. In this case, for example, data representing the point A1 is preset to the counter 26E, and the counter 26E is counted down with the driving of the motor 16. The driving of the motor 16 is stopped when the content of the counter 26E becomes zero. By doing so, it is also possible to shift the capillary 8 to the point A1.

Figure 7A:
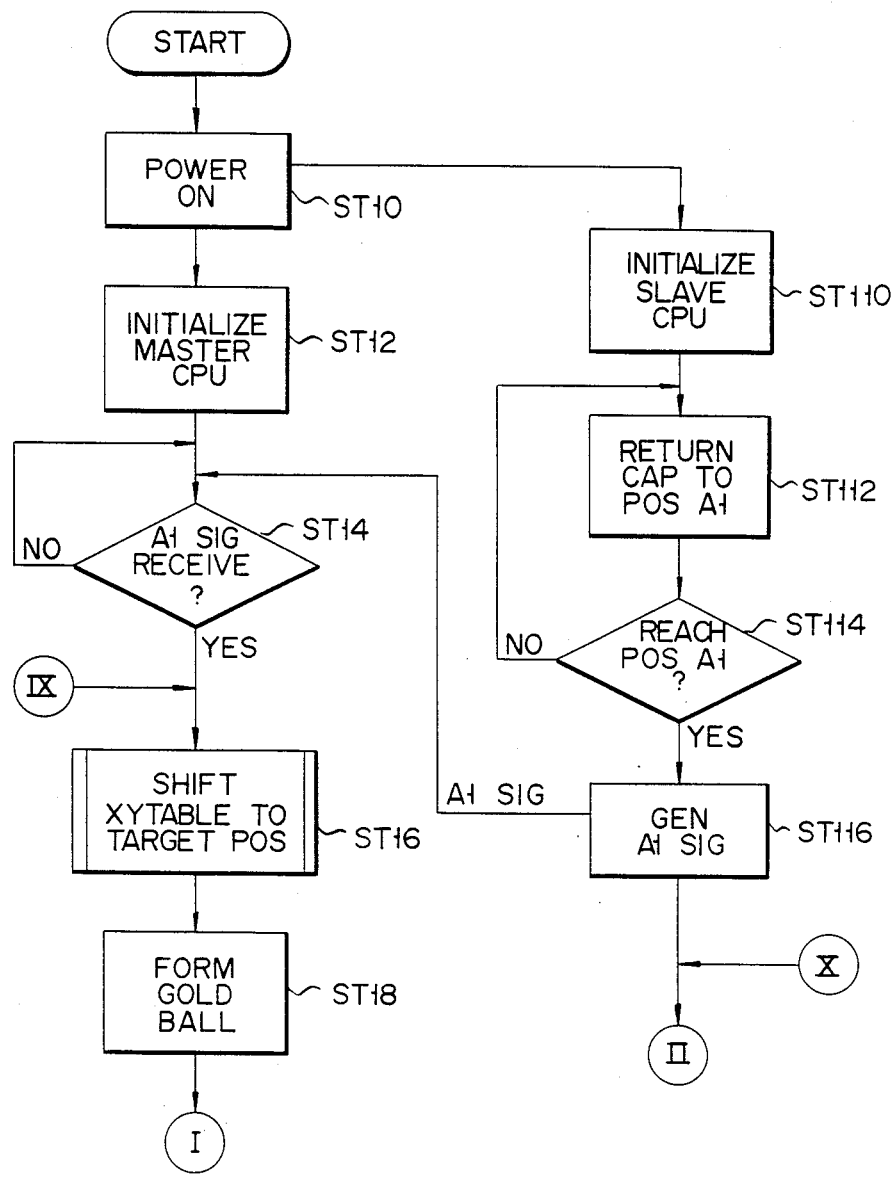
FIGS. 7A to 7E are flow charts showing the operation sequence of the wire bonding apparatus having the configuration shown in FIG. 6.

In the flow of FIG. 7A, the power switch of the bonding apparatus of FIG. 2 is turned on (ST10). Thereupon, the master and slave CPU's 25A and 26B are initialized (ST12, ST110). As a result of the initiation, the CPU 26B orders the driver 28 to raise the capillary 8 (ST112). When the capillary 8 is in the position corresponding to the content A0 of the counter 26E, the up-drive signal E26 is supplied to the driver 28 until the content of the counter 26E is increased from A0 to A1 (FIG. 3A; ST114, NO). When the capillary 8 reaches the position corresponding to A1, the CPU 26B detects that the content of the counter 26E has become A1 (ST114, YES), and generates a signal A1 (ST116).

Before receiving the signal A1 from the slave CPU 26B, the master CPU 25A is on stand-by as it is initialized (ST14, NO). When the CPU 25A receives the signal A1 (ST14, YES), it delivers a prescribed position data to the XY table control circuit 60. Thereupon, the capillary 8 is shifted over a given bonding pad of the IC pellet 9 indicated by the position data (ST16). Then, the end of the gold thin wire at the tip end of the capillary 8 is melted by an electric torch (not shown). Thus, the gold ball 29 as shown in FIG. 4A is formed at the end of the wire (ST18).

Figure 7B:
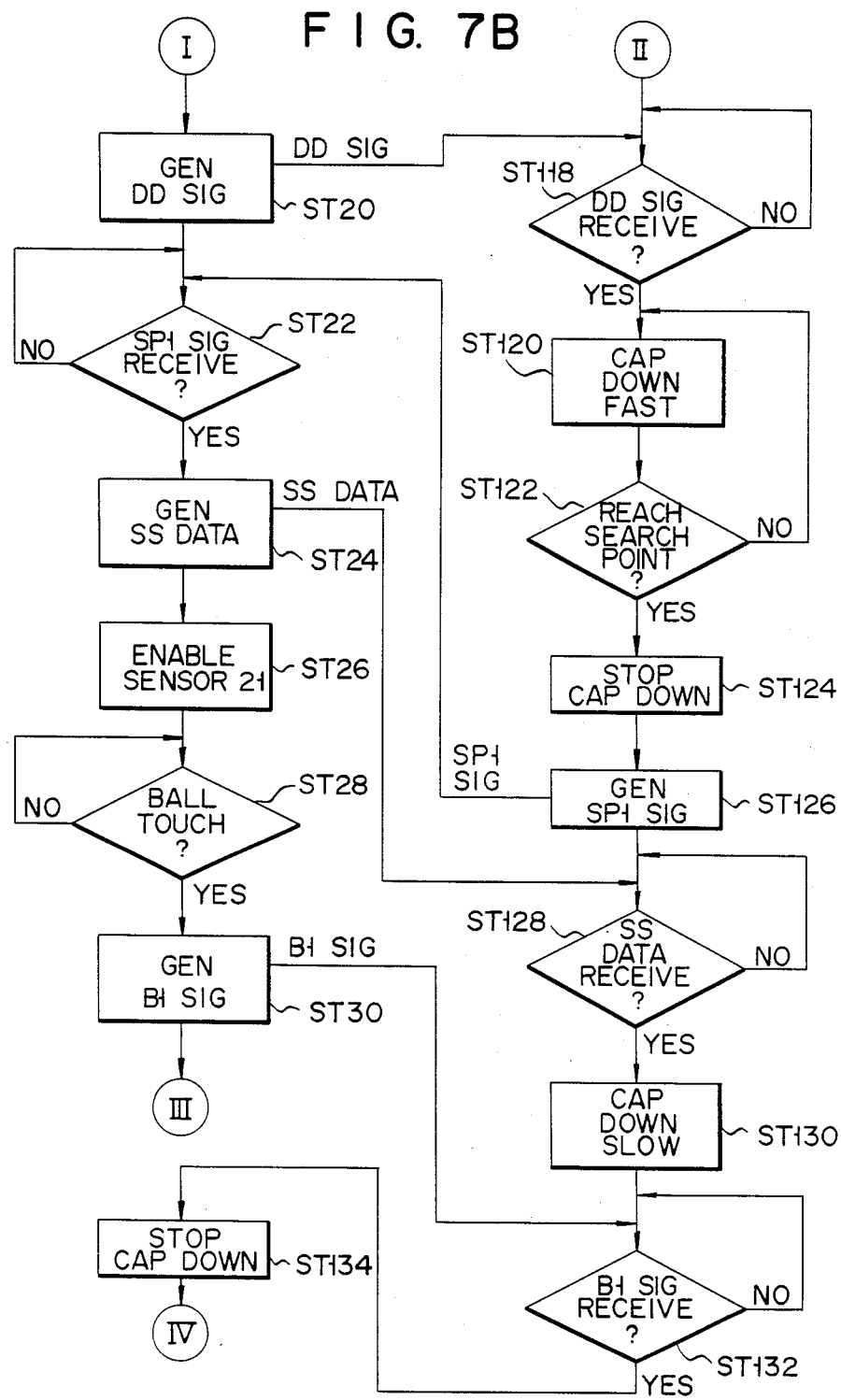

After the gold ball 29 is formed at the end of the capillary 8, the CPU 25A delivers a signal DD to the CPU 26B to execute down designation for the capillary 8 (ST20 in FIG. 7B). Before receiving the signal DD, the CPU 26B holds the capillary 8 in the position A1 of FIG. 3A (ST118, NO). When the CPU 26B receives the signal DD (ST118, YES), it quickly lowers the capillary 8 (ST120). This quick descent corresponds to the slope from point A1 to point SP1 of FIG. 3A. The descent of the capillary 8 causes a decrement of the content of the counter 26E from A1 to SP1 (ST112, NO). When the capillary 8 reaches the position corresponding to the search point SP1, the CPU 26B detects that the content of the counter 26E has become SP1 (ST122, YES), and stops the capillary 8 from descending (ST124). When the capillary 8 is stopped, the CPU 26B delivers the signal SP1 to the CPU 25A (ST126).

Before receiving the signal SP1, the CPU 25A interrupts the execution of the sequence after the signal DD is generated (ST22, NO). When the CPU 25A receives the signal SP1 (ST22, YES), it produces data SS which indicates the descending speed (search speed) of the capillary 8 (ST24). The descending speed based on the data SS corresponds to the slope from point SP1 to point B1 of FIG. 3A.

Before receiving the data SS, the CPU 26B interrupts the execution of the sequence after the signal SP1 is generated (ST128, NO). When the CPU 26B receives the data SS (ST128, YES), it lowers the capillary 8 at a slow speed indicated by the data SS (ST130). As the capillary 8 is lowered in this manner, the content of the counter 26E is decreased from SP1 to B1 (ST132, NO). When the capillary 8 starts to descend, the CPU 25A enables the gap sensor 21 (ST26). When enabled, the sensor 21 starts to monitor to see if the gold ball 29 (FIG. 4A) at the end of the capillary 8 has touched the pellet 9 (ST29, NO). When the gold ball 29 touches the pellet 9 (ST28, YES), the potential of the output signal E21 from the sensor 21 rises suddenly (FIG. 3B). When this sudden rise is caused, the CPU 25A delivers a signal B1 to the CPU 26B (ST30). Receiving the signal B1 (ST132, YES), the CPU 26B stops the capillary 8 from descending (ST134).

Figure 7C:
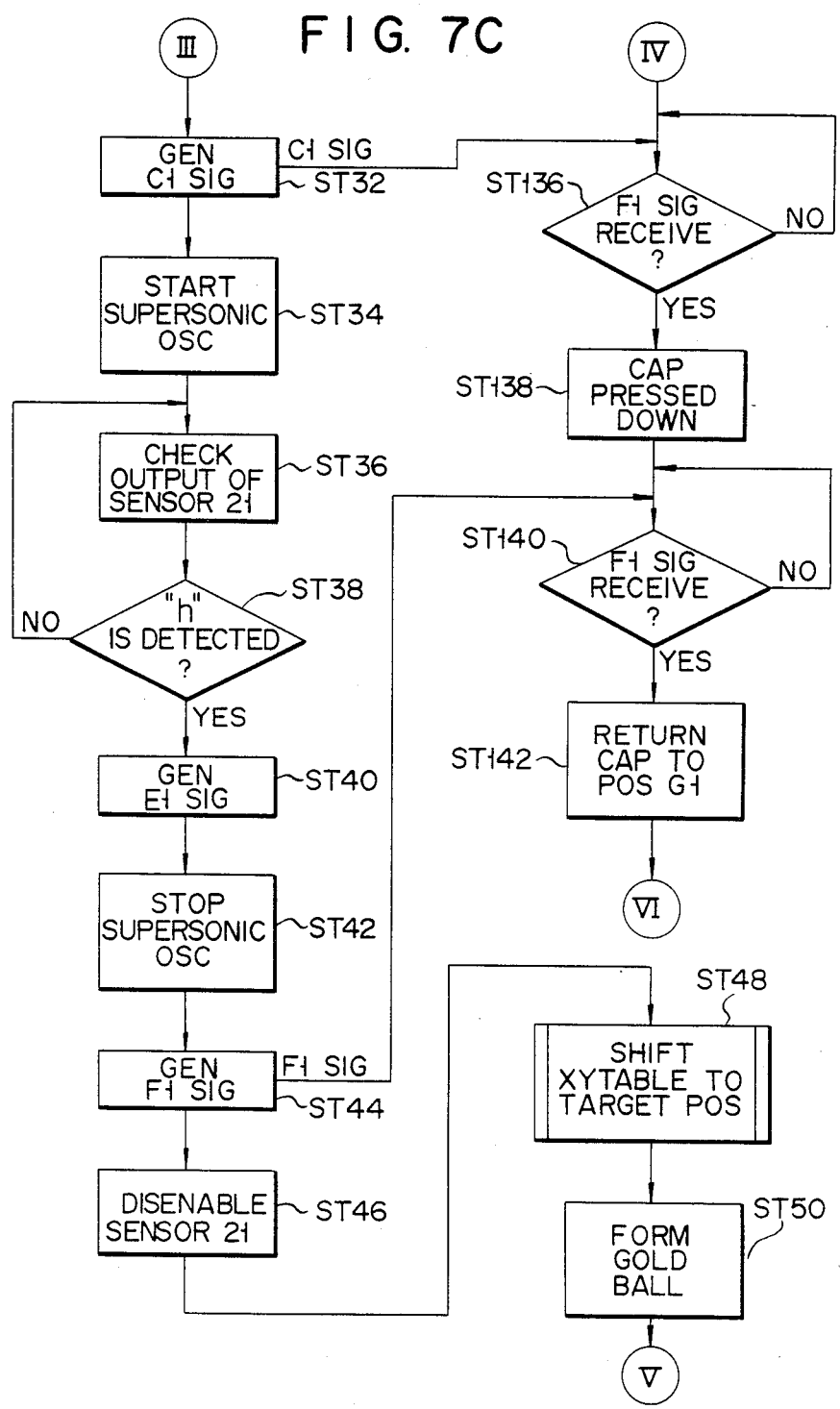

After generating the signal B1, the CPU 25A supplies a signal C1 to the CPU 26B (ST32 in FIG. 7C). The signal C1 is also transmitted as the oscillation start instruction D25 to the supersonic oscillator 27. Before receiving the signal C1, the CPU 26B keeps the capillary 8 from descending (ST136, NO). When the CPU 26B receives the signal C1 (ST136, YES), it lowers the capillary 8 slowly so that the gold ball 29 is softly pressed against the bonding pad of the pellet 9 (ST138). Immediately before the pressing action starts, the CPU 25A actuates the supersonic oscillator 27 (ST34). As the capillary 8 is thus lowered with the supersonic oscillation (ST34, ST138), the gold ball 29 is crushed gradually (FIGS. 4B to 4D). As the gold ball 29 is crushed in this manner, the potential of the sensor output E21 is lowered (FIG. 3B, point C2 to E2). The potential drop is checked by the CPU 25A (ST36). The check of the output E21 is continued in accordance with the change of the digital value of the digital signal E24 until the value of the potential drop of the output E21 corresponds to the predetermined value h (ST38, NO). The value h is known data stored in the RAM 25C at the time of initialization (ST12).

When the value of the potential drop of the output E21 corresponds to the value h (ST38, YES), the CPU 25A generates a signal E1 (ST40). The signal E1 is delivered as the oscillation stop instruction D25 to the supersonic oscillator 27. Thereupon, the oscillator 27 is stopped (ST42). Namely, the oscillator 27 supplies a supersonic output E27 as shown in FIG. 3C to the supersonic vibrator 23 (FIG. 2) during the time interval from the instant that the signal C1 is generated (ST32) until the signal E1 is generated (ST40). Also during this time interval (ST32 to ST40), the sensor output E21 undergoes a potential drop equivalent to the potential difference h.

After the supersonic oscillation is stopped, the CPU 25A delivers a signal F1 to the CPU 26B (ST44). Before receiving the signal F1, the CPU 26B continues to press the capillary 8 (ST140, NO). When the CPU 26B receives the signal F1 (ST140, YES), it orders the driver 28 to raise the capillary 8 suddenly (ST142). Then, the capillary 8 rises and stops at the position where the content of the counter 26E becomes G1 (ST142). The moment the signal F1 is generated, the gap sensor 21 is disenabled (ST46). Then, the capillary 8 is shifted over the predetermined lead frame (ST48). This shift is executed by the XY table control circuit 60. Then, the gold ball 29 is formed on the gold wire at the tip end of the capillary 8 (ST50). The formation is done by means of the torch exciter 62.

Figure 7D:
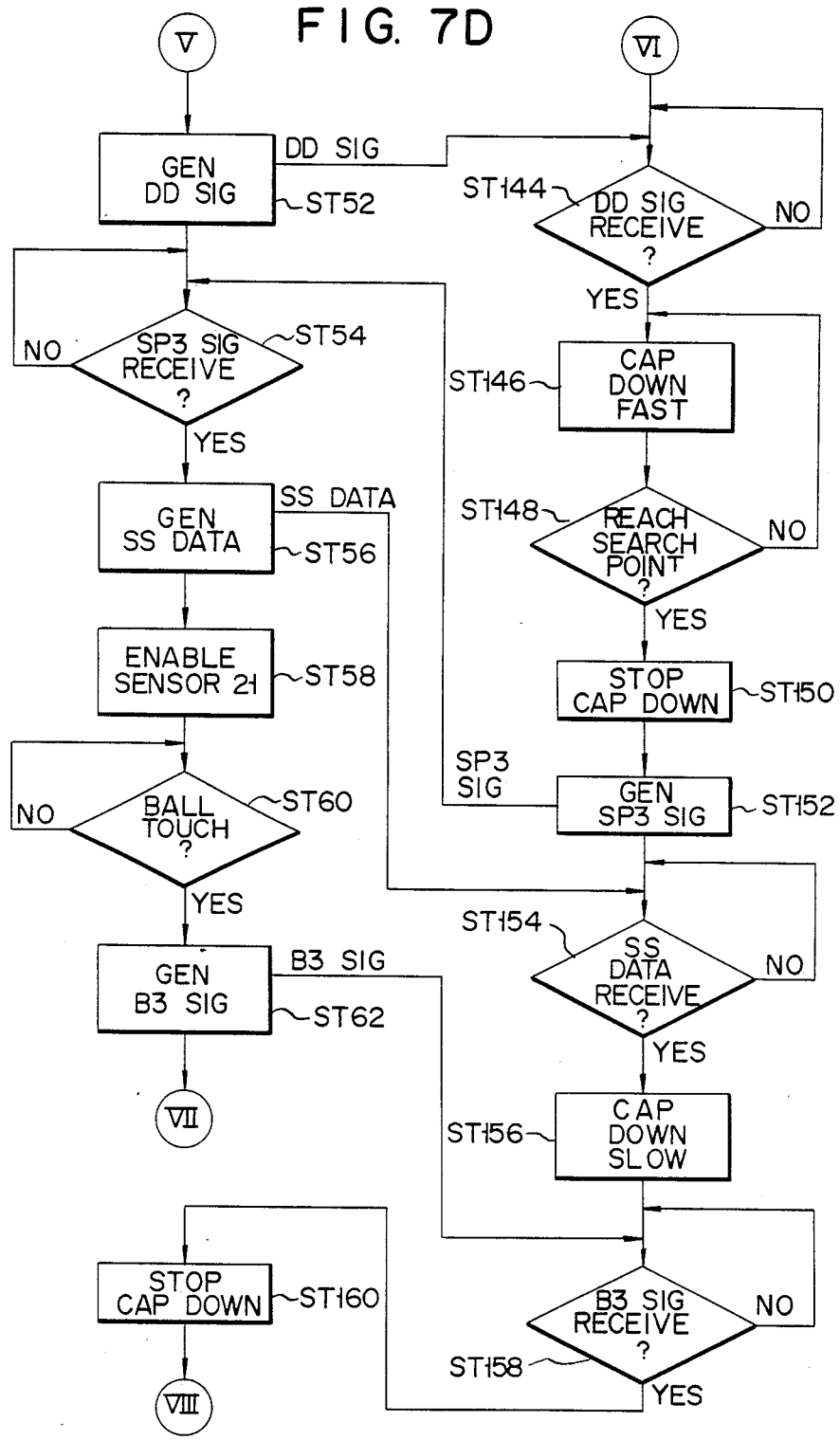

After the gold ball 29 is formed at the end of the capillary 8, the CPU 25A delivers a signal DD to the CPU 26B to execute down designation for the capillary 8 (ST52 in FIG. 7D). Before receiving the signal DD, the CPU 26B holds the capillary 8 in the position G1 of FIG. 3A (ST144, NO). When the CPU 26B receives the signal DD (ST144, YES), it quickly lowers the capillary 8 (ST146). This quick descent corresponds to the slope from point G1 to point SP3 of FIG. 3A. The descent of the capillary 8 causes a decrement of the content of the counter 26E from G1 to SP3 (ST148, NO). When the capillary 8 reaches the position corresponding to the search point SP3, the CPU 26B detects that the content of the counter 26E has become SP3 (ST148, YES), and stops the capillary 8 from descending (ST150). When the capillary 8 is stopped, the CPU 26B delivers the signal SP3 to the CPU 25A (ST152).

Before receiving the signal SP3, the CPU 25A interrupts the execution of the sequence after the signal DD is generated (ST54, NO). When the CPU 25A receives the signal SP3 (ST54, YES), it produces data SS which indicates the descending speed (search speed) of the capillary 8 (ST56). The descending speed based on the data SS corresponds to the slope from point SP3 to point B3 of FIG. 3A.

Before receiving the data SS, the CPU 26B interrupts the execution of the sequence after the signal SP3 is generated (ST154, NO). When the CPU 26B receives the data SS (ST154, YES), it lowers the capillary 8 at a slow speed indicated by the data SS (ST156). As the capillary 8 is lowered in this manner, the content of the counter 26E is decreased from SP3 to B3 (ST158, NO). When the capillary 8 starts to descend, the CPU 25A enables the gap sensor 21 (ST58). When enabled, the sensor 21 starts to monitor to see if the gold ball 29 (FIG. 4A) at the end of the capillary 8 has touched the lead frame (ST60, NO). When the gold ball 29 touches the lead frame (ST60, YES), the potential of the output signal E21 from the sensor 21 rises suddenly (FIG. 3B). When this sudden rise is caused, the CPU 25A delivers a signal B3 to the CPU 26B (ST62). Receiving the signal B3 (ST158, YES), the CPU 26B stops the capillary 8 from descending (ST160).

Figure 7E:
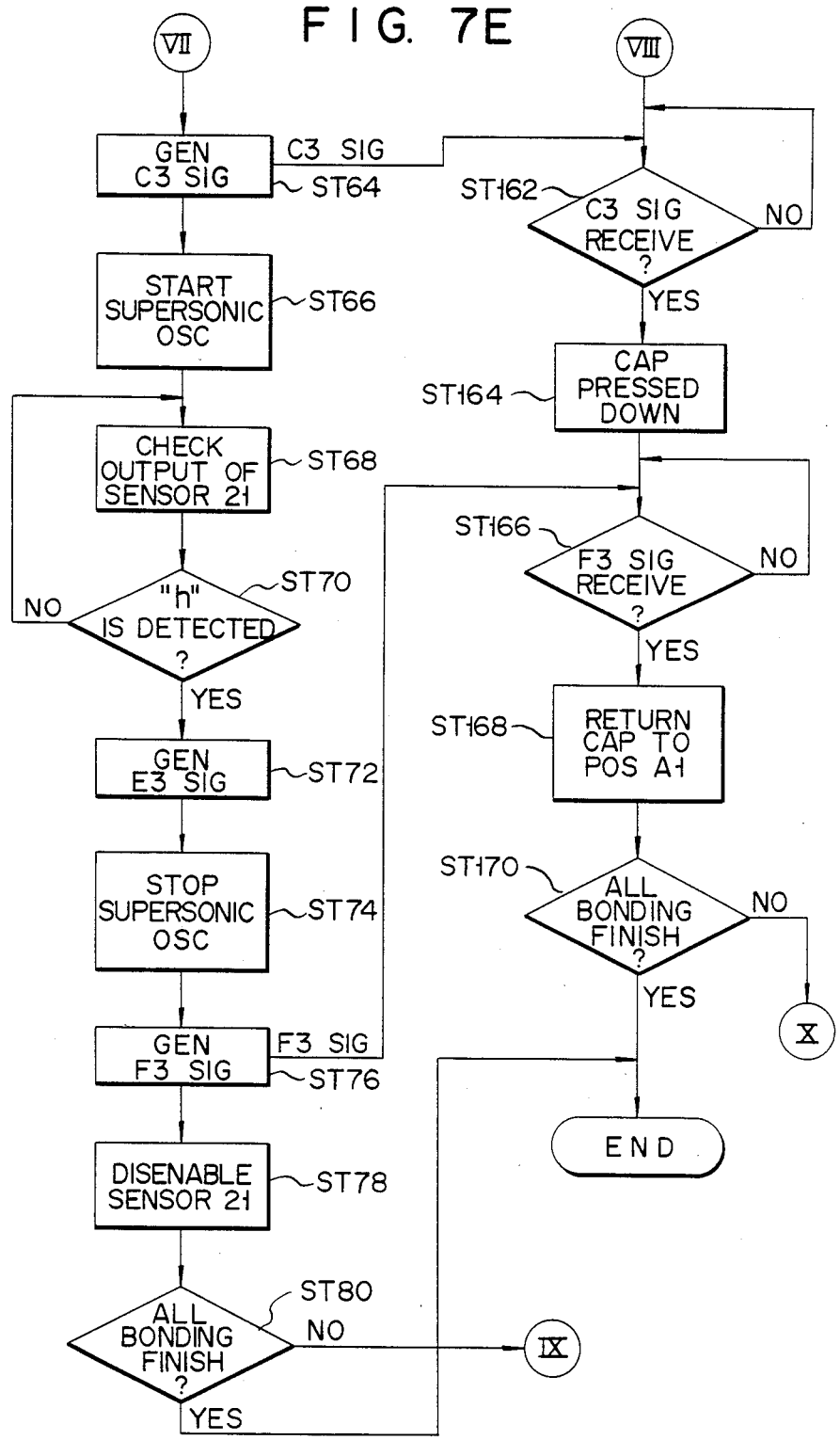

After generating the signal B3, the CPU 25A supplies a signal C3 to the CPU 26B (ST64 in FIG. 7E). The signal C3 is also transmitted as the oscillation start instruction D25 to the supersonic oscillator 27. Before receiving the signal C3, the CPU 26B keeps the capillary 8 from descending (ST162, NO). When the CPU 26B receives the signal C3 (ST162, YES), it lowers the capillary 8 slowly so that the gold ball 29 is softly pressed against the bonding portion of the lead frame (ST164). Immediately before the pressing action starts, the CPU 25A actuates the supersonic oscillator 27 (ST66). As the capillary 8 is thus lowered with the supersonic oscillation (ST66, ST164), the gold ball 29 is crushed gradually (FIGS. 4B to 4D). As the gold ball 29 is crushed in this manner, the potential of the sensor output E21 is lowered (FIG. 3B, point C4 to E4). The potential drop is checked by the CPU 25A (ST68). The check of the output E21 is continued in accordance with change of the digital value of the digital signal E24 until the value of the potential drop of the output E21 corresponds to the predetermined value h (ST70, NO). The value h is known data stored in the RAM 25C at the time of initialization (ST12).

When the value of the potential drop of the output E21 corresponds to the value h (ST70, YES), the CPU 25A generates a signal E3 (ST72). The signal E3 is delivered as the oscillation stop instruction D25 to the supersonic oscillator 27. Thereupon, the oscillator 27 is stopped (ST74). Namely, the oscillator 27 supplies the supersonic output E27 as shown in FIG. 3C to the supersonic vibrator 23 (FIG. 2) during the time interval from the instant that the signal C3 is generated (ST64) until the signal E3 is generated (ST72). Also during this time interval (ST64 to ST72), the sensor output E21 undergoes a potential drop equivalent to the potential difference h.

After the supersonic oscillation is stopped, the CPU 25A delivers a signal F3 to the CPU 26B (ST76). Before receiving the signal F3, the CPU 26B continues to press the capillary 8 (ST116, NO). When the CPU 26B receives the signal F3 (ST166, YES), it orders the driver 28 to raise the capillary 8 suddenly (ST168). Then, the capillary 8 rises and stops at the position where the content of the counter 26E becomes A1 (ST168). The moment the signal F3 is generated, the gap sensor 21 is disenabled (ST78). Thus, wiring between one bonding pad and one lead frame is finished. Then, all the processes of bonding operation are checked for completion (ST80, ST170). If the bonding operation is not completed, steps ST80 and ST170 are followed by steps ST16 and ST118, respectively. If the bonding operation is completed, all the sequence is finished at steps ST80 and ST170. Decisions at steps ST80 and ST170 can be made on the basis of the contents of index counters (not shown) of the CPU's 25A and 26B.

FIG. 8 shows a specific example of the gap sensor 21. The sensor 21 includes a bridge circuit which is formed of a sensor coil 21B having a slidable ferrite core 21A, an adjustable inductor 21C, and resistors 21D and 21E. An RF oscillator 21F with oscillation frequency of, e.g., 1 MHz is connected between the junction node of the coil 21B and the inductor 21C and that of the resistors 21D and 21E. The primary coil of an RF transformer 21G is connected between the junction node of the inductor 21C and the resistor 21D and that of the coil 21B and the resistor 21E. An RF signal (AC) induced at the secondary coil of the transformer 21G is converted into the DC signal E21 by a rectifier circuit formed of a diode 21H, a capacitor 21I, and a resistor 21J.

When the slidable core 21A touches the tool arm 7 of FIG. 2, is slides inside the coil 21B. The inductor 21C is so adjusted that the bridge is balanced, i.e., E21=0 V, when the core 21A is not in touch with the arm 7. When the core 21A moves in touch with the arm 7, the inductance of the coil 21B changes to break the balance of the bridge. Thereupon, the signal E21 has a DC potential corresponding to the degree of the breakage of the balance or the displacement of the core 21A.

Figure 9:
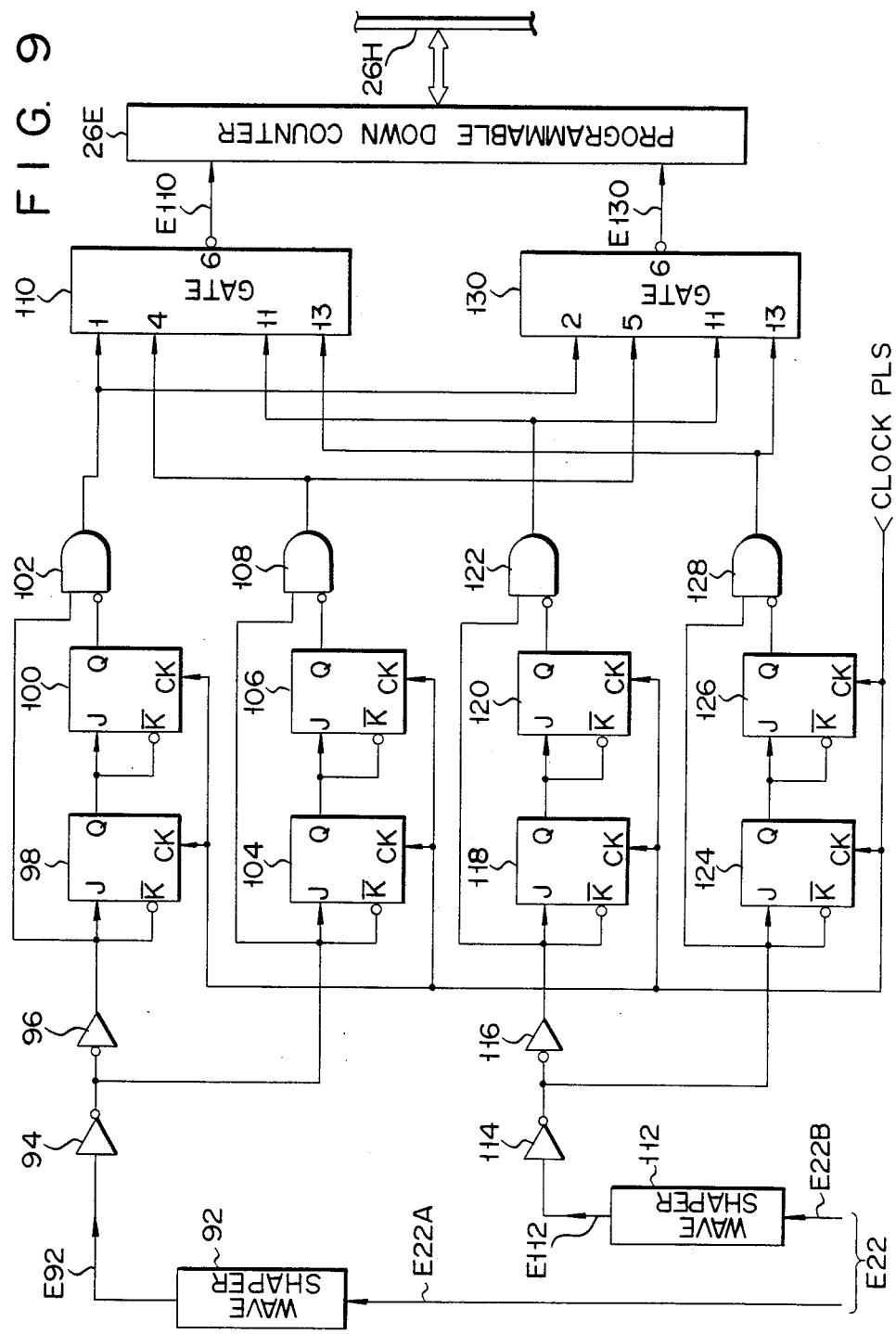
FIG. 9 is a circuit diagram showing a configuration of a direction discriminator 26F shown in FIG. 6.

FIG. 9 shows a configuration of the direction discriminator 26F. The output E22 of the position detector 22 consists of two sinusoidal wave signals E22A and E22B. The signal E22A is converted into a rectangular wave signal E92 by a wave shaper 92, while the signal E22B is converted into a rectangular wave signal E112 by a wave shaper 112. The signal E92 is applied through inverters 94 and 96 to the noninverted input of an AND gate 102 and the J and inverted $\overline{K}$ inputs of a JK flip-flop (JK-FF) 98. The Q output of the JK-FF 98 is applied to the J and inverted $\overline{K}$ inputs of a JK-FF 100. The Q output of the JK-FF 100 is applied to the inverted input of the AND gate 102. The output signal of the inverter 94 is applied to the noninverted input of an AND gate 108 and the J and inverted $\overline{K}$ inputs of a JK-FF 104. The Q output of the JK-FF 104 is applied to the J and inverted $\overline{K}$ inputs of a JK-FF 106. The Q output of the JK-FF 106 is applied to the inverted input of the AND gate 108.

Likewise, the signal E112 is applied through inverters 114 and 116 to the noninverted input of an AND gate 122 and the J and inverted $\overline{K}$ inputs of a JK-FF 118. The Q output of the JK-FF 118 is applied to the J and inverted $\overline{K}$ inputs of a JK-FF 120. The Q output of the JK-FF 120 is applied to the inverted input of the AND gate 122. The output signal of the inverter 114 is applied to the noninverted input of an AND gate 128 and the J and inverted $\overline{K}$ inputs of a JK-FF 124. The Q output of the JK-FF 124 is applied to the J and inverted $\overline{K}$ inputs of a JK-FF 126. The Q output of the JK-FF 126 is applied to the inverted input of the AND gate 128.

The JK-FF's 98, 100, 104, 106, 118, 120, 124 and 126 are clocked with pulses synchronizing with, e.g., the operating clock of the CPU 26B shown in FIG. 6.

The output of the AND gate 102 is applied to an input pin 1 of a gate circuit 110 and an input pin 2 of a gate circuit 130. The output of the AND gate 108 is applied to an input pin 4 of the circuit 110 and an input pin 5 of the circuit 130. The output of the AND gate 122 is applied to respective input pins 11 of the circuits 110 and 130, while the output of the AND gate 128 is applied to respective input pins 13 of the circuits 110 and 130. Model #SN74 LS54 from Texas Instruments Inc., USA, may be used for the gate circuits 110 and 130. A logic circuit represented by the truth table of TABLE 1 may be used in place of the model #SNLS54 for the circuits 110 and 130.

TABLE I

| INPUT PIN | | | | | | OUTPUT PIN |
|---|---|---|---|---|---|---|
| 1 | 2 | 4 | 5 | 11 | 13 | 6 |
| 1 | 1 | x | x | x | x | 1 |
| x | x | 1 | 1 | x | x | 1 |
| x | x | x | x | 1 | x | 1 |
| x | x | x | x | x | 1 | 1 |

Note:
The symbol "x" denotes a logic level of "0" or "1". The logic level of output pin 6 is "0" when other logic level combinations then these in table 1 are applied to the input pins.

In FIG. 9, the signal E22A is advanced or lagged in phase compared with the signal E22B. Namely, there is a certain phase difference between the two signals E22A and E22B. When the capillary 8 goes up, the signal E22A leads the signal E22B in phase. When the capillary 8 goes down, on the other hand, the signal E22A lags behind the signal E22B in phase. The discriminator 26F detects the phase lead or lag to discriminate between the ascent and descent of the capillary 8. The displacement of the capillary 8 can be detected by counting the repeat number of the signal E22A or E22B by means of the counter 26E. When the capillary 8 ascends, the programmable counter 26E counts down in accordance with an output E110 of the circuit 110 until the preset value in the counter 26E becomes zero. The preset value is fed from CPU 26B through the bus 26H. When the capillary 8 descends, the counter 26E counts down in accordance with an output E130 of the circuit 130 until the preset value becomes zero. Thus, the capillary 8 is shifted to the position corresponding to the preset value (control target) when the count value in the counter 26E becomes zero.

In the embodiment described above, the contact between the capillary and the pellet and the fall amount of the capillary caused by fusion of the gold ball are detected by a single gap sensor. Alternatively, however, the contact between the capillary and the pellet may be detected by a sensor provided independently of the sensor 21. The linear motor for driving the tool lifter arm may be replaced with a DC servo motor or a combination of a pulse motor and a screw feed mechanism. Besides an eddy-current type displacement sensor, an optical or magnetic displacement sensor may be used for the gap sensor. Moreover, the amplitude AM (FIG. 3C) of the supersonic vibration may be controlled simultaneously with the supersonic oscillation time.

Figure 10:
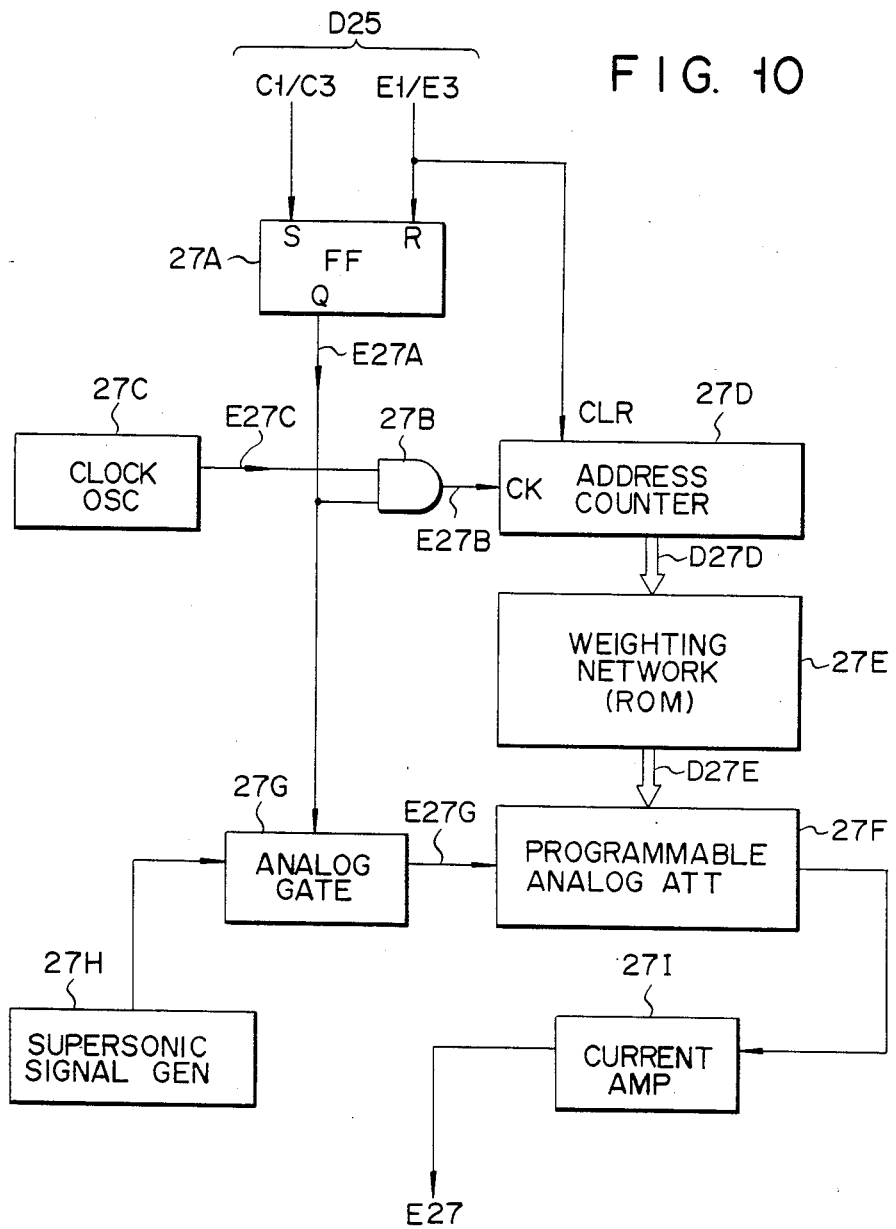
FIG. 10 is a block diagram showing a configuration of a supersonic oscillator 27 shown in FIG. 2.

FIG. 10 shows a configuration of the supersonic oscillator 27 shown in FIG. 2. The oscillation start/stop instruction D25 delivered from the control circuit 25 consists of a start signal C1 (or C3) and a stop signal E1 (or E3). The signal C1 (or C3) is generated by the CPU 25A (FIG. 6) in step ST32 of FIG. 7C (or ST64 of FIG. 7E). The signal E1 (or E3) is generated by the CPU 25A in step ST40 of FIG. 7C (or ST72 of FIG. 7E). The signal C1 (C3) sets an RS-FF 27A, while the signal E1 (E3) resets the RS-FF 27A and clears an address counter 27D. A Q output E27A of the RS-FF 27A is applied to one input of an AND gate 27B and the gate input of an analog gate 27G. A clock pulse E27C from a clock oscillator 27C is applied to the other input of the AND gate 27B. An anded output E27B of the gate 27B is applied to the clock input of the counter 27D. A count output data D27D of the counter 27D is used as an address data of a weighting network (ROM) 27E. The ROM 27E delivers an attenuation data D27E (corresponding to the data D27D on the basis of an address designated by the data D27D.

The attenuation data D27E is applied to a programmable analog attenuator 27F. The attenuator 27F is also supplied with a supersonic signal E27G from a supersonic signal generator 27H through the analog gate 27G. The signal E27G is attenuated with an attenuation degree (gain) corresponding to the data D27E, and is applied to a current amplifier 27I. The amplifier 27I power-amplifies the attenuated signal applied thereto and supplies it to the supersonic vibrator 23.

FIGS. 11A to 11H are diagrams for illustrating the operation of the supersonic oscillator 27 shown in FIG. 10. When the capillary 8 reaches point C1 of FIG. 11A in a pad bonding process, the CPU 25A (FIG. 6) generates the signal C1 as shown in FIG. 11C (ST32 in FIG. 7C). The RS-FF 27A is set by the signal C1 to open the AND gate 27B and the analog gate 27G. Thereupon, the counter 27D starts to count the clock pulse E27B. By this counting operation, the count output data D27D is increased for each clock of the pulse E27B, as shown in FIG. 11E. The readout address of the ROM 27E is changed every time the data D27D is increased. With the change of the address, the attenuation data D27E also changes. As a result, the attenuation degree of the attenuator 27F changes, and the amplitude of the supersonic signal E27 changes corresponding to the data D27D.

When the capillary 8 reaches point E1 of FIG. 11A, the CPU 25A generates the signal E1 as shown in FIG. 11D (ST40 in FIG. 7C). The RS-FF 27A and the counter 27D are reset and cleared, respectively, by the signal E1. At the same time, the AND gate 27B and the analog gate 27G are closed, and the supersonic signal E27 is extinguished.

Likewise, in a lead frame bonding process, the counter 27D counts the pulses E27B to deliver the data D27D during the time interval which elapses from the instant that the signal C3 is generated (ST64 in FIG. 7E) until the signal E3 is generated (ST72).

The manner in which the amplitude of the signal E27 changes according to the data D27D depends on the content of the ROM 27E. FIG. 11F shows the signal E27 obtained when the attenuation degree of the attenuator 27F is reduced in proportion to the data D27D which increases monotonously. FIG. 11G shows the signal E27 obtained when the attenuation degress is increased after it is once reduced as the data D27D is increased. FIG. 11H shows a case where the attenuation degree changes in one mode for the pad bonding process and in another for the lead frame bonding process. In the pad bonding process, the attenuation degree is exponentially increased corresponding to the increase of the data D27D. In the lead frame bonding process, on the other hand, it is fixed irrespectively of the change of the data D27D. In this case, the counting operation of the counter 27D is stopped and a fixed data is preset in the counter 27D in response to the signal C3, and the counter 27D is cleared in response to the signal E3. The supersonic signal E27 may have any other envelopes depending on the content of the ROM 27E. In a case where the signal E27 has a fixed amplitude (FIG. 3C), the signal E27G may be applied directly to the input of the current amplifier 27I.

According to the present invention, as described above, the supersonic oscillator 27 is controlled for adjustment of the oscillation time and/or the amplitude of supersonic oscillation, while monitoring deformation of the ball by means of the gap sensor 21 which detects the relative positions of the tool lifter arm 4 and the tool arm 7. Accordingly, the bonded ball may have a regular shape, even if the supersonic vibrational energy applied to the ball is changed by varied conditions, and the bonding portion is improved in reliability. Thus, the ball may be prevented from being crushed to cause short circuiting with surrounding electrodes, or from being separated from the pellet, greatly improving the yield.

What is claimed is:

1. A wire bonding apparatus comprising:
    tool means for carrying a wire having a bonding ball at an end portion of said wire and for transferring said bonding ball to a bonding target;
    supersonic means coupled to said tool means for supplying said bonding ball with supersonic vibration energy;
    detector means coupled to said tool means and responsive to a force produced between said bonding ball and said bonding target when said bonding ball contacts said bonding target for generating a contact signal corresponding to said force; and bonding control means, coupled to said detector means and said supersonic means, for defining said supersonic vibration energy, in accordance with a change in a level of said contact signal.

2. An apparatus according to claim 1, wherein said tool means includes arm means for holding said bonding ball portion and for changing a relative distance between said bonding ball and said bonding target, drive means coupled to said arm means for effecting said relative distance change between said bonding ball and said bonding target, position sensor means coupled to said arm means, and responsive to said relative distance, for generating a position signal representing said relative distance, and position control means coupled to said position sensor means, said drive means and said bonding control means, for servo-controlling said arm means such that said relative distance depends on said position signal and on a command signal, indicating a control target of the servo control, delivered from said bonding means.

3. An apparatus according to claim 2, wherein said bonding control means includes oscillation command means for generating an oscillation command during a period when the level of said contact signal falls within a predetermined range, and wherein said supersonic means performs a supersonic oscillation with a given constant amplitude to provide said supersonic vibration energy only during the period when said oscillation command is generated.

4. An apparatus according to claim 2, wherein said bonding control means includes oscillation command means for generating an oscillation command during a period when the level of said contact signal falls within a predetermined range, and wherein said supersonic means performs a supersonic oscillation with an amplitude being varied in accordance with the period during which said oscillation command is generated, thereby supplying supersonic vibration energy.

5. An apparatus according to claim 4, wherein said supersonic means includes:

signal source means for generating a first supersonic signal during the period when said oscillation command is generated, amplitude instruction means for generating an amplitude instruction which varies with a given rate during the period when said oscillation instruction is generated, amplifier means coupled to said signal source means and to said amplitude instruction means, for changing the amplitude of said first supersonic signal in accordance with said amplitude instruction to provide a second supersonic signal, and supersonic vibrator means coupled to said amplifier means for supplying said bonding ball with said supersonic vibration energy which corresponds to the amplitude of said second supersonic signal.

6. An apparatus according to claim 1, wherein said bonding control means includes oscillation command means for generating an oscillation command during a period when the level of said contact signal falls within a predetermined range, and wherein said supersonic means performs a supersonic oscillation with a given constant amplitude to provide said supersonic vibration energy only during the period when said oscillation command is generated.

7. An apparatus according to claim 1, wherein said bonding control means includes oscillation command means for generating an oscillation command during a period when the level of said contact signal falls within a predetermined range, and wherein said supersonic means performs a supersonic oscillation with an amplitude being varied in accordance with the period during which said oscillation command is generated, thereby supplying supersonic vibration energy.

8. Apparatus according to claim 7, wherein said supersonic means includes:

signal source means for generating a first supersonic signal during the period when said oscillation command is generated, amplitude instruction means for generating an amplitude instruction which varies with a given rate during the period when said oscillation instruction is generated, amplifier means coupled to said signal source means and to said amplitude instruction means, for changing the amplitude of said first supersonic signal in accordance with said amplitude instruction to provide a second supersonic signal, and supersonic vibrator means coupled to said amplifier means for supplying said bonding ball with said supersonic vibration energy which corresponds to the amplitude of said second supersonic signal.

9. A wire bonding apparatus which is provided with a tool lifter arm moving up and down in accordance with power delivered from a drive source, a tool arm attached to said tool lifter arm and having a capillary for holding a wire with a bonding ball, and a supersonic generator attached to said tool arm for supplying said capillary with a supersonic vibration, said wire bonding apparatus comprising:

position sensor means, coupled to said tool lifter arm, for sensing the movement of said tool lifter arm and for generating a position sensor signal containing information of said movement;

tool control means, coupled to said drive source and said position sensor means, for controlling the power from said drive source so that movement of said tool lifter arm is varied in accordance with said position sensor signal;

gap sensor means, coupled to said tool lifter arm, for sensing the relative position of said tool arm with respect to said tool lifter arm and for generating a gap sensor signal having a level representing said relative position; and bonder control means, coupled to said gap sensor means and said supersonic generator, for detecting deformation of said bonding ball according to a change in the level of said gap sensor signal, and for determining the supply of said supersonic vibration according to the degree of deformation of said bonding ball.

* * * * *

UNITED STATES PATENT AND TRADEMARK OFFICE
CERTIFICATE OF CORRECTION

PATENT NO. : 4,571,688
DATED : February 18, 1986
INVENTOR(S) : Tomio KASHIHARA, Katsuhiko AOYAGI It is certified that error appears in the above—identified patent and that said Letters Patent is hereby corrected as shown below:

ON THE FIRST INFORMATION PAGE:

Change "[73] Assignee: Tokyo Shibaura Denki Kabushiki Kaisha, Japan" to --[73] Assignee: Tokyo Shibaura Denki Kabushiki Kaisha, Kawasaki, Japan--.

Signed and Sealed this

Ninth Day of September 1986

[SEAL]

Attest:

DONALD J. QUIGG

Attesting Officer     Commissioner of Patents and Trademarks